United States Patent [19]

Janusas

[11] Patent Number: 5,640,419
[45] Date of Patent: Jun. 17, 1997

[54] COVERT COMMUNICATION SYSTEM

[75] Inventor: Saulius Janusas, Seacliff, N.Y.

[73] Assignee: Grumman Aerospace Corporation, Los Angeles, Calif.

[21] Appl. No.: 275,750

[22] Filed: Jul. 19, 1994

[51] Int. Cl.⁶ .................................................. H03K 7/04
[52] U.S. Cl. ........................ 375/239; 375/343; 370/213
[58] Field of Search ................................. 375/239, 240, 375/343; 370/109, 10, 8; 358/426; 380/36

[56] References Cited

U.S. PATENT DOCUMENTS 5,029,184  7/1991  Andren et al. ..................... 375/267

*Primary Examiner*—Stephen Chin
*Assistant Examiner*—T. Ghebretinsae
*Attorney, Agent, or Firm*—Terry J. Anderson; Karl J. Hoch, Jr.

[57] ABSTRACT

A covert communication system utilizes a series of low level duty cycle coded pulse train transmissions which at the necessary end have signal to noise ratios much smaller than unity. Such transmissions are buried in noise and hence are undetectable by ordinary means. The coded pulse trains do not carry data and their sole purpose is only to be compressed by a code matched correlator into a single large pulse per pulse train. Data are encoded in the timing between adjacent compressed pulses of adjacent pulse trains. The low duty cycle of the pulse trains is used to force an unfriendly receiver, which does not know the code of the pulse train transmissions, to integrate its own receiver noise into its detection circuits, thus making the transmissions even less detectable.

11 Claims, 3 Drawing Sheets

COVERT COMMUNICATION SYSTEM

BACKGROUND OF THE INVENTION

1. Field of the Invention

This invention relates to the field of electro-magnetic communications, and in particular to a system for covertly modulating and demodulating an electromagnetic carrier wave so as to convey information from a transmitting device to a receiving device.

2. Description of Related Art

Modulation is the process of converting a message into information-bearing signals that not only unambiguously represent the message but also are suitable for propagation over a transmitting medium to a receiver. In pulse modulation, the carrier of the message is in the form of an electromagnetic wave which has been modulated to form a train of regularly recurrent pulses, the structure or arrangement of the individual pulses in the pulse train carrying the message. The transmitting medium may be the earth's atmosphere, outer space, or a man-made carrier such as an electrical or optical cable.

Conventionally, pulse modulation is accomplished by controlling the amplitude, duration, position, or mere presence of the pulses so as to represent the message to be communicated. These conventional forms of pulse modulation are commonly referred to as, respectively, pulse-amplitude modulation (PAM), pulse-duration modulation (PDM), pulse-position modulation (PPM), and pulse-code modulation (PCM).

PCM systems, in particular, are widely used in public and private communications by all branches of the military, Comsat, Intelsat, NASA, and private sector companies in virtually every country. By having to make only on or off distinctions, PCM is able to deliver a high quality signal even when noise and interference are so bad that it is barely possible to recognize the pulses, and thus PCM transmissions are especially suitable for the transmission of complex encoded messages. In addition, pulse communication systems, and especially PCM systems, have the advantages that the hardware and/or software required to send and receive such communications is generally simple, the resulting pulse trains are relatively easy to detect, and, once detected, the information content of a pulse train is readily extracted.

On the other hand, the ease of detection and data extraction advantages of pulse communications are disadvantages when the communications are intended to be covert. Encryption of the data can be used to make the communications and/or the content of the communications more difficult to detect by unfriendly parties, but the complexity of the system required to send and receive the messages greatly increases and, in the case of communications where the very existence of the communication, rather than just the information content, must be kept secret, conventional pulse communication systems are less than optimal. This is the case, for example, for communications during covert missions in unfriendly airspace.

SUMMARY OF THE INVENTION

In view of the disadvantages of conventional pulse modulation systems for use in covert communications, the present invention has the following primary objectives:

1.) to provide a communication system apparatus and method which prevents unauthorized listeners from detecting the transmissions;

2.) to provide a communication system apparatus and method, which, even if transmissions are detected, prevents the listener from determining the data content; and 3.) to provide a covert communication system apparatus and method which uses inexpensive non-coherent transmitters and receivers.

Additional objectives of the invention are to provide a covert communication system which can be used in either radio or cable broadcast formats, which is resistant to jamming, and which is insensitive to doppler and therefore can be used on high speed airborne platforms without the need for doppler compensation.

These objectives are achieved by providing a pulse communication system which includes a pulse code generator/encoder, preferably in the form of an on-off or PCM type pulse generator/encoder, a transmitter/modulator for transmitting the encoded pulses as pulse trains, and a receiver designed to detect the presence of particular coded sequences or trains of pulses transmitted by the pulse modulator/transmitter, and process the pulses in such a way that data can be extracted. Uniquely, the coded pulse trains themselves carry no data. Instead, the coding of the pulses is for the sole purpose of enabling processing of the pulse trains by those familiar with the encoding scheme in such a way that data can be extracted from the processed pulses.

In a preferred embodiment of the invention, the processing of the pulse trains involves pulse compression by a correlator, while the information content of the transmission is represented by the timing of the correlated compressed pulses relative to each other, the timing being meaningful only if the incoming pulse trains are properly compressed, which requires knowledge of the encoding scheme.

If the code required by the correlator to compress the pulses is not known, then even the existence of the pulse trains cannot easily be detected because any attempt by a party unfamiliar with the coded sequence to integrate a suspected signal will also result in integration of natural or man-made noise between the pulses, the relative quantity of which may be increased by using a relatively low duty cycle pulse generator/encoder at the transmitting end to increase the spacing and narrow the width of the pulses. Furthermore, even if the unfriendly receiver were to somehow build a correlator capable of obtaining sufficient correlation to detect the transmissions, the information content of the transmissions would still be protected by the pulse compression feature, because any compression with less than adequate correlation would create time sidelobes which would hide the true data.

The low level of transmissions, which make detection of the pulses difficult, nevertheless has the advantage of requiring especially simple hardware to implement, both because of the low power and because of the on-off design, and yet the information conveyed is completely unambiguous. In fact, the lower the duty cycle and signal-to-noise ratio, the more difficult the signal will be to detect by unfriendly receivers.

Those skilled in the art will appreciate that this is contrary to the usual case in which lower quality components decrease rather than increase security. In addition, it will be appreciated by those skilled in the art that because the system is noncoherent, it is therefore insensitive to relative transmitter-to-receiver motion-induced doppler effects, and also to jamming.

DETAILED DESCRIPTION OF THE PREFERRED EMBODIMENTS

Figure 1:
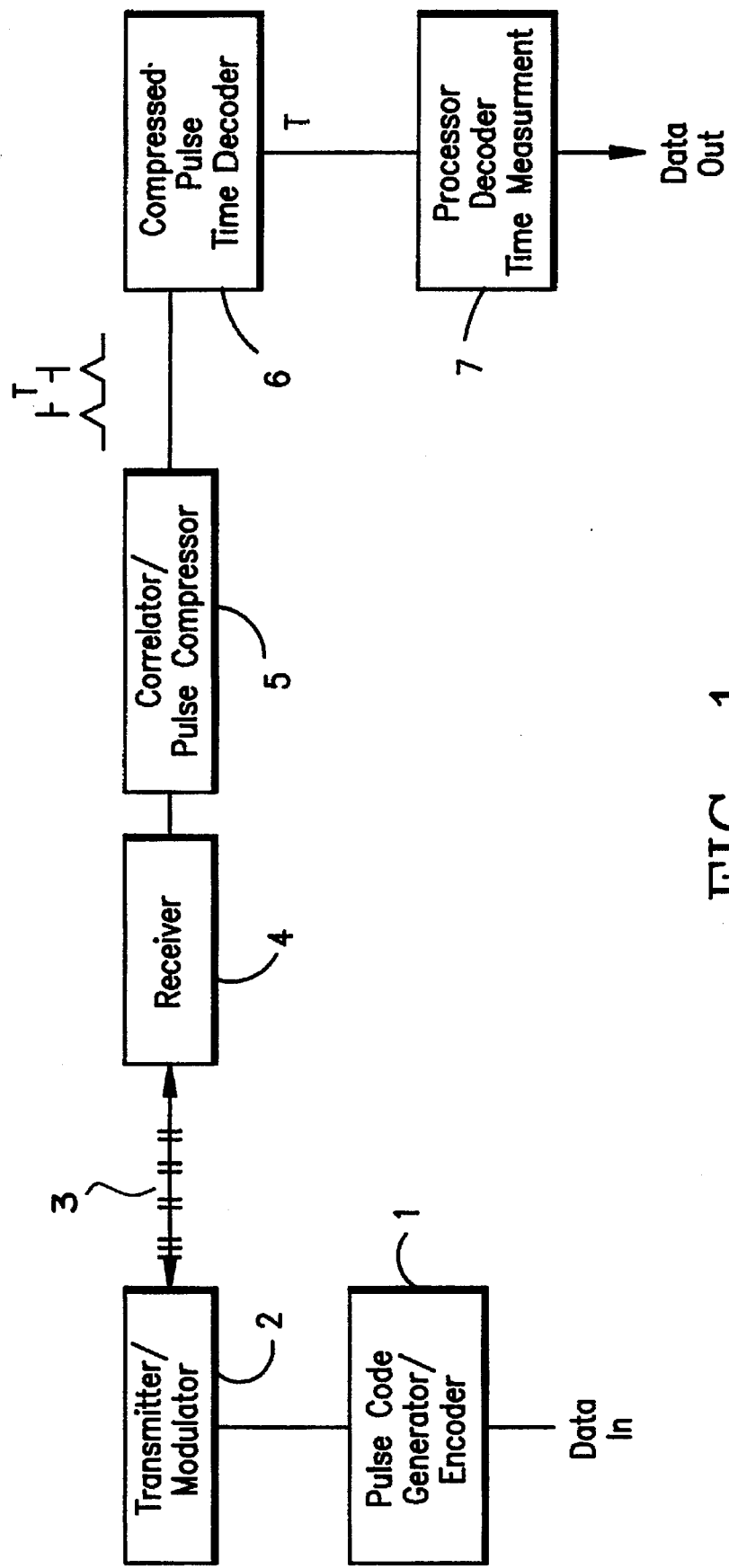
FIG. 1 is a block diagram of a communication system constructed in accordance with the principles of a preferred embodiment of the invention.

FIG. 1 is a functional block diagram of a one way pulse communication system which embodies the principles of the invention, but which can readily be constructed by those skilled in the art from conventional components. The system includes a low duty cycle pulse code generator/encoder 1 which generates relatively widely spaced pulses, and a transmitter/modulator 2 for impressing the pulses on a carrier wave to form a pulse train 3 having a signal-to-noise (S/N) ratio of much less than unity.

The transmitted pulse trains are received by receiver 4 and correlated by a correlator/pulse compressor 5 with a known pulse train in order to extract the transmitted pulses in each pulse train and process them by compressing them to form a single compressed pulse. If the encoding scheme of the pulse trains is unknown, then even the existence of the pulse trains is likely to go undetected because the actual pulses will be buried in noise present in the received signal between the pulses. Unless the receiver is familiar with the encoding scheme and knows when to capture or integrate a pulse, the receiver will also integrate any noise present in the signal from sources both internal and external to the receiver/correlator. The greater the spacing between the pulses, the more noise will be captured before the next pulse arrives, and the less likely a receiver will be able to distinguish between a received pulse and the noise. Any attempt to compress a detected pulse train without excluding the captured noise will result in a compressed pulse having sidelobes sufficient to obscure the peak, and therefore make further analysis of the compressed pulses futile.

Once a train of pulses is compressed by the correlator to form a single compressed pulse, the information content of the transmission is extracted by analyzing the time relationship between compressed pulses. In the preferred embodiment, this is accomplished by sending the pulses a compressed pulse time decoder 6 which measures the period T between successive compressed pulses. This period T between successive pulses obtained by compressing the received pulse trains conveys the information content of the transmission, as determined by processor decoder circuit 7, which can be as simple as a look-up table for associating a particular timing with a predetermined bit of data.

Thus, the sole purpose for coding the transmitted pulses is to match them to the correlator code so that received pulse trains can be compressed into single pulses. The compressed pulses, in this embodiment, mark the time points of a message. The information is thus encoded by the timing between respective compressed pulses extracted or obtained from two separate coded pulse groups or trains. At the transmission end, generation of the pulse trains is simply a reverse process from the decoding process, i.e., one controls the pulse generator by calculating what sequence of pulses in a pulse train, when compressed into single pulse, will have the desired parameters.

Figure 2:
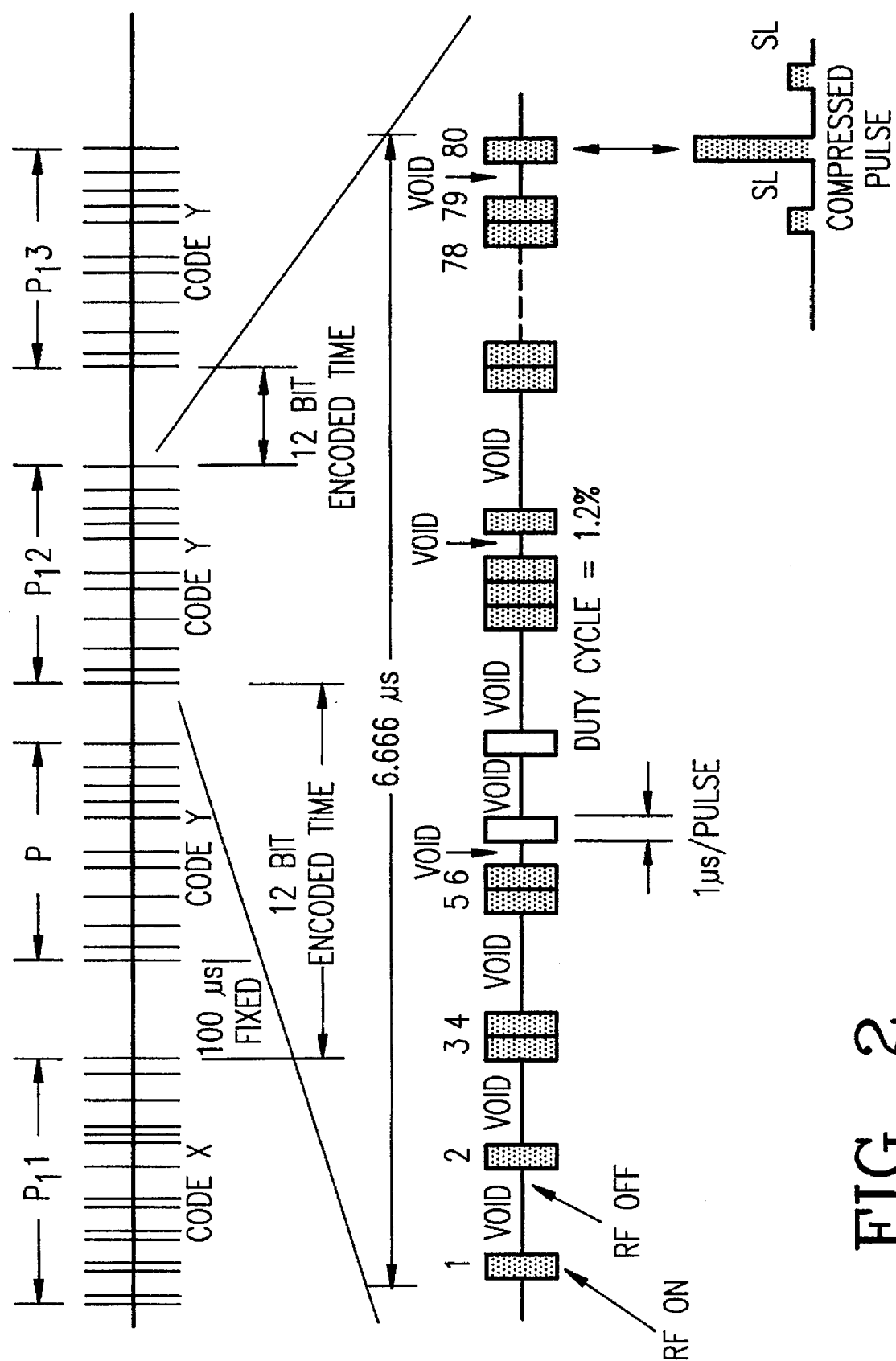
FIG. 2 illustrates an exemplary pulse format for the communication system of FIG. 1, such as might be employed for interrogations in a two way transponder type communications system.
Figure 3:
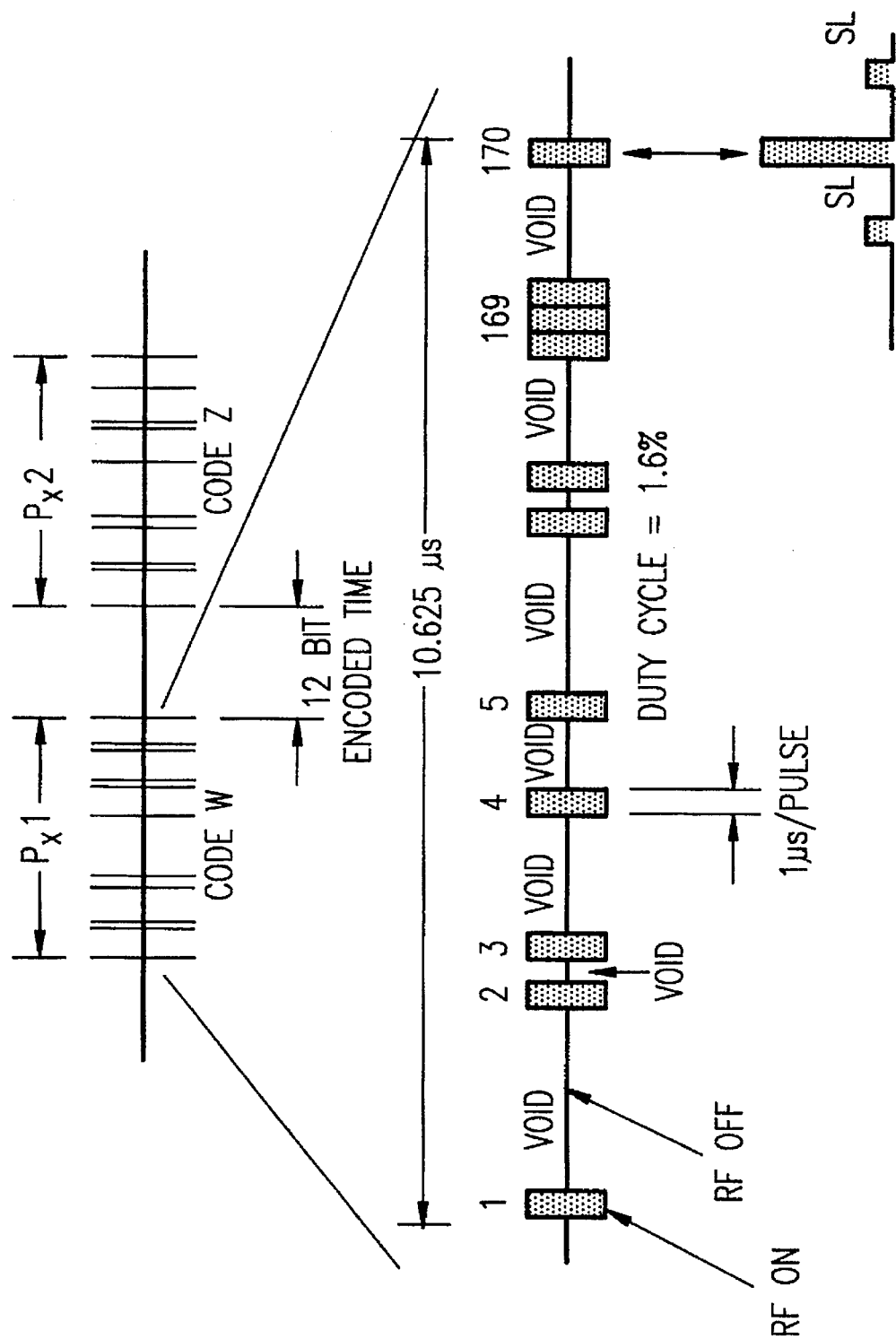
FIG. 3 illustrates a second exemplary pulse format for the communication system of FIG. 1, such as might be used for replies in a two way transponder type communications system.

FIGS. 2 and 3 illustrate waveforms of the type used in two-way communications between transceivers. One of the transceivers serves as an interrogator and the other as the transponder. In the example shown, system accuracy requires pulse widths which are compatible in measuring range. Low Probability of Intercept (LPI) dictates low effective radiated power (ERP) emission. A typical Datalink requires 24 data bits on the interrogation and 12 data bits on the response channel. Both the interrogation and reply waveforms are similar, except that the interrogation consists of four pulse-groups, and the reply waveform consist of two pulse-groups.

Those skilled in the art will recognize that the number of pulse-groups or trains in each waveform will depend on the requirements of the particular application in which the system is used, as will the size of the groups and individual pulses, the duty cycles, and other dimensions described below.

The interrogator of the illustrated example transmits 80 one microsecond pulses with a 1.2% duty factor per group, and the transponder transmits 170 one microsecond pulses with a 1.6% duty factor per group, which means that the sum of the pulse widths in the respective pulse trains is only 1.2% and 1.6% of the total width of the pulse trains, with the remainder constituting the intervals between pulses. Since the modulators are only "on" for 1.2 and 1.6 percent of the time, respectively, both power requirements and the probability of detection are low, and yet the system is more robust than conventional systems. In the example shown, the envelopes or widths of the pulse trains with voids are 6,666 and 10,625 microseconds for the interrogator and transponder, respectively. Because each pulse position is encoded, pulse integration processing allows the power output of the transmitter to be reduced by the integration gain on reception. The required power output from the transmitter in the exemplary configuration will be on the order of a few milliwatts.

When a sequence of the wide pulse-trains is compressed (four pulse-trains from interrogation and two pulse-trains from the reply), they provide a very accurate spacing between compressed pulses. The data is transmitted by encoding the time between compressed pulses. In the example shown, 4,096 ($2^{12}$) one microsecond slots are provided between each pulse group or pair. Each of these space intervals is equivalent to 12 bits. A transponder reply contains one slot corresponding to 12 bits of data.

Although a preferred embodiment of the system has been described with sufficient particularity to enable one skilled in the art to make and use the system, it will be appreciated by those skilled in the art that numerous variations and modifications of the invention are possible. Consequently, it is intended that the invention not be limited by the above description, but rather that it be defined solely by the appended claims.

We claim:
1. Covert communication apparatus, comprising:
   a transmitter including:
      means for transmitting pulse trains having a low duty cycle such that individual pulses are widely spaced apart at intervals corresponding to a predetermined pattern, and whereby any attempt to receive and integrate the pulses to form a compressed pulse will also receive and integrate a substantial amount of noise unless the predetermined pattern of pulses is known; and
   a receiver including:
      means for detecting and integrating the widely spaced individual pulses of the pulse trains to form compressed pulses;

means for analyzing the compressed pulses to extract an information content of the communication.

2. Apparatus as claimed in claim 1, wherein said means for analyzing the compressed pulses comprises means for measuring a timing between the compressed pulses.

3. Apparatus as claimed in claim 1, further comprising an on-off modulator for generating said widely spaced pulse trains, said on-off modulator having a low duty cycle.

4. Apparatus as claimed in claim 3, wherein a duty cycle of said on-off modulator is on the order of 1.2% to 1.6%.

5. Apparatus as claimed in claim 1, wherein a signal-to-noise ratio of the transmitted pulse trains is much less than unity.

6. Apparatus as claimed in claim 2, wherein the means for analyzing the compressed pulses comprises a look-up table for looking up a meaning assigned to the measured timing.

7. A covert communication method, comprising the steps of:

transmitting pulse trains having a low duty cycle such that individual pulses are widely spaced apart at intervals corresponding to a predetermined pattern, and whereby any attempt to receive and integrate the pulses to form a compressed pulse will also receive and integrate a substantial amount of noise unless the predetermined pattern of pulses is known;

detecting and integrating the widely spaced individual pulses of the pulse trains to form compressed pulses; and analyzing the compressed pulses to extract an information content of the communication.

8. A method as claimed in claim 7, wherein the step of analyzing the compressed pulses comprises the step of measuring a timing between the compressed pulses.

9. A method as claimed in claim 7, wherein the step of transmitted pulse trains having a low duty cycle comprises the step of generating pulses with a duty cycle of on the order of 1.2% to 1.6%.

10. A method as claimed in claim 7, wherein the step of transmitting the pulse trains comprises the step of transmitting pulse trains having a signal-to-noise ratio of less than unity.

11. A method as claimed in claim 8, wherein the step of measuring a timing between the compressed pulses comprises the step of using a look-up table to look up a meaning assigned to the measured timing.

* * * * *